(12) United States Patent
Blomiley et al.

(10) Patent No.: US 6,911,367 B2
(45) Date of Patent: Jun. 28, 2005

(54) METHODS OF FORMING SEMICONDUCTIVE MATERIALS HAVING FLATTENED SURFACES; METHODS OF FORMING ISOLATION REGIONS; AND METHODS OF FORMING ELEVATED SOURCE/DRAIN REGIONS

(75) Inventors: Eric R. Blomiley, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 10/418,696

(22) Filed: Apr. 18, 2003

(65) Prior Publication Data

US 2004/0209446 A1 Oct. 21, 2004

(51) Int. Cl.[7] .......................... H01L 21/20; H01L 21/36
(52) U.S. Cl. .................... 438/300; 438/429; 438/493; 438/502; 438/509
(58) Field of Search ................................ 438/222, 296, 438/300, 360, 429, 493, 495, 502, 509

(56) References Cited

U.S. PATENT DOCUMENTS

| | | | |
|---|---|---|---|
| 3,956,037 A | * 5/1976 | Ishii et al. ................ 438/495 |
| 5,227,330 A | 7/1993 | Agnello et al. | |
| 5,378,651 A | 1/1995 | Agnello et al. | |
| 6,162,706 A | * 12/2000 | Dutartre et al. ............. 438/481 |
| 6,277,677 B1 | 8/2001 | Lee | |
| 6,291,310 B1 | * 9/2001 | Madson et al. ............. 438/424 |
| 6,368,927 B1 | 4/2002 | Lee | |
| 6,376,318 B1 | 4/2002 | Lee et al. | |
| 6,429,095 B1 | 8/2002 | Sakaguchi et al. | |
| 6,436,776 B2 | 8/2002 | Nakayama et al. | |
| 6,455,399 B2 | 9/2002 | Malik et al. | |
| 6,489,241 B1 | 12/2002 | Thilderkvist et al. | |
| 6,528,387 B1 | * 3/2003 | Moriyasu et al. ........... 438/404 |
| 6,589,336 B1 | * 7/2003 | Ebara et al. .................. 117/94 |

FOREIGN PATENT DOCUMENTS

WO  WO 9858408 A1 * 12/1998  ......... H01L/21/324

* cited by examiner

*Primary Examiner*—Stephen W. Smoot
(74) *Attorney, Agent, or Firm*—Wells St. John P.S.

(57) ABSTRACT

The invention includes methods of forming epitaxially-grown semiconductive material having a flattened surface, and methods of incorporating such material into trenched regions and elevated/source drain regions. A method of forming epitaxially-grown semiconductive material having a flattened surface can include the following. Initially, a single crystal first semiconductor material is provided. A second semiconductive material is epitaxially grown from a surface of the first semiconductor material. The epitaxial growth is stopped, and subsequently an upper surface of the second semiconductor material is exposed to at least one hydrogen isotope to reduce curvature of (i.e., flatten) a surface of the second semiconductor material.

18 Claims, 4 Drawing Sheets

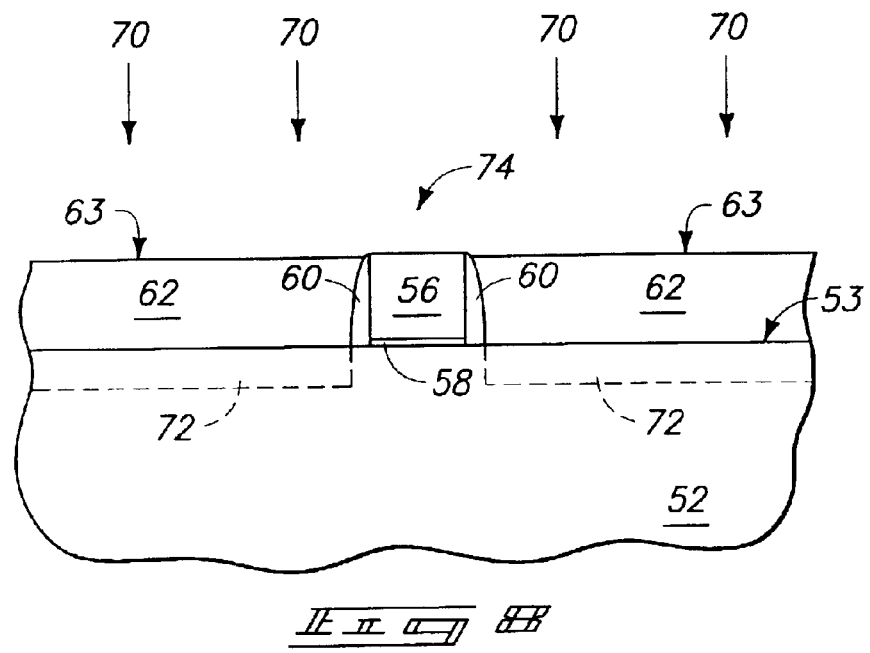
_Fig. 8_
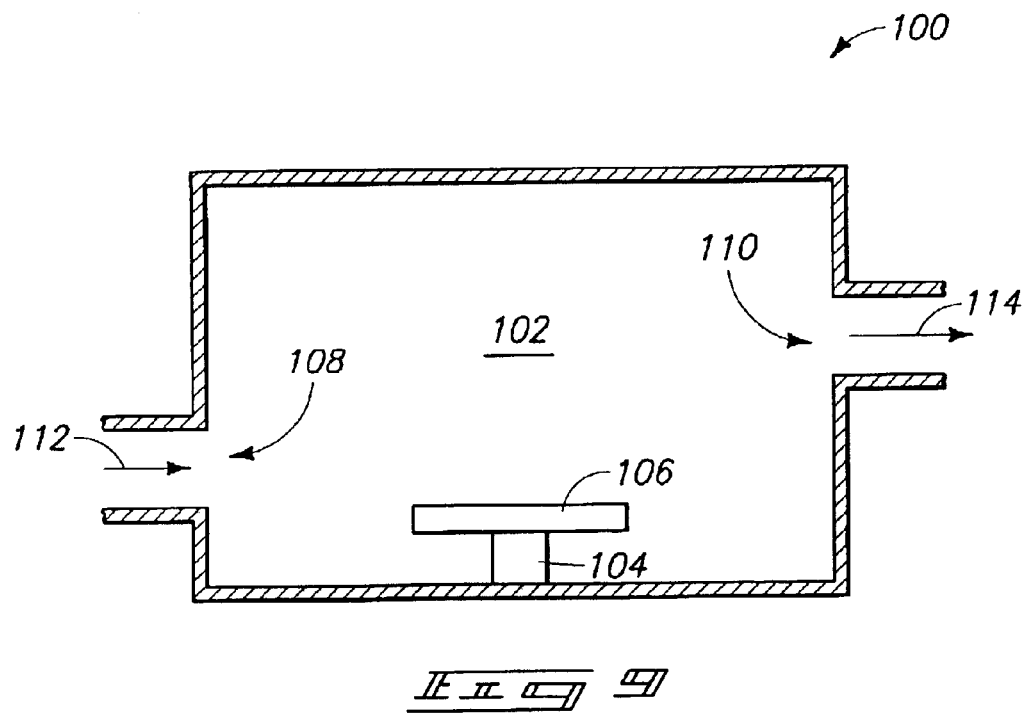
_Fig. 9_

US 6,911,367 B2

METHODS OF FORMING SEMICONDUCTIVE MATERIALS HAVING FLATTENED SURFACES; METHODS OF FORMING ISOLATION REGIONS; AND METHODS OF FORMING ELEVATED SOURCE/DRAIN REGIONS

TECHNICAL FIELD

The invention pertains to methods of reducing curvature across surfaces of epitaxially-grown silicon. In particular aspects, the invention pertains to methods of forming isolation regions, and in other particular aspects the invention pertains to methods of forming elevated source/drain regions.

BACKGROUND OF THE INVENTION

Epitaxially-grown silicon has many applications. For instance, epitaxially-grown silicon can be incorporated into elevated source/drain regions of transistor devices. A problem that can be encountered in utilizing epitaxially-grown silicon is that an upper surface of the epitaxially-grown material can be curved, which can complicate further processing.

It would be desirable to develop methods by which curvature could be removed from an upper surface of epitaxially-grown silicon to flatten the upper surface.

In another aspect of the prior art, trenched regions are commonly utilized in semiconductor fabrication. For instance, trenched isolation regions are frequently utilized to electrically isolate adjacent transistor devices associated with a semiconductor substrate.

The trenched regions are typically openings (trenches) extending into a semiconductor material and filled with an appropriate material (such as, for example, an electrically insulative material for trenched isolation regions). It can be difficult to uniformly fill the openings under particular conditions, such as, for example, when the critical dimension of the openings is high. It would therefore be desirable to develop new methods of forming trenched regions.

SUMMARY OF THE INVENTION

In one aspect, the invention encompasses a method of forming a semiconductive material having a flattened surface. A single crystal first semiconductor material is provided, and a second semiconductive material is epitaxially-grown from a surface of the first semiconductor material. The epitaxial growth is stopped, and subsequently an upper surface of the second semiconductor material is exposed to at least one hydrogen isotope to reduce curvature of (i.e., flatten) a surface of the second semiconductor material.

In one aspect, the invention encompasses a method of forming a trenched region. An opening is formed to extend into a single crystal first semiconductor material. The opening has a bottom comprising the first semiconductor material. A second semiconductor material is epitaxially-grown from the bottom of the opening to partially fill the opening. A substance is subsequently formed over the second semiconductor material within the opening. The trenched region can be a trenched isolation region, and in such aspect the substance can be an insulative material.

In one aspect, the invention encompasses a method of forming elevated source/drain regions. A semiconductor substrate is provided, and semiconductor material is epitaxially-grown upwardly from the substrate to form a pair of elevated source/drain regions of a transistor device. The epitaxial growth is stopped, and subsequently an upper surface of the epitaxially-grown semiconductor material is exposed to at least one hydrogen isotope. The exposure to the hydrogen isotope flattens the upper surface of the epitaxially-grown material. Conductivity-enhancing dopant is implanted into the epitaxially-grown material, typically after the surface of the epitaxially-grown material is flattened. The doped epitaxially-grown material corresponds to elevated source/drain regions, and such source/drain regions are gatedly connected to one another through a transistor gate to form the transistor device.

BRIEF DESCRIPTION OF THE DRAWINGS

Preferred embodiments of the invention are described below with reference to the following accompanying drawings.

FIG. 8 is a view of the FIG. 5 wafer fragment shown at a processing stage subsequent to that of FIG. 7, in accordance with the second aspect of the invention.

FIG. 9 is a diagrammatic, cross-sectional view of a reaction chamber suitable for utilization in various aspects of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Selective epitaxial semiconductor growth within laterally restricted regions can result in undesirably-shaped surface profiles of the epitaxially-grown material. Specifically, the epitaxially-grown material can have a curved surface, which is unsuitable for particular applications. One aspect of the present invention is a recognition that epitaxially-grown semiconductor materials have the undesired surface curvature. Another aspect of the invention is development of methodology to reduce the curvature, and accordingly to flatten the surface of the epitaxially-grown materials. For purposes of interpreting this disclosure and the claims that follow, a surface is "flattened" by a treatment if the surface becomes more flat after the treatment than it had been prior to the treatment. Accordingly, a "flattened" surface can be, but need not be, planar.

Figure 1:
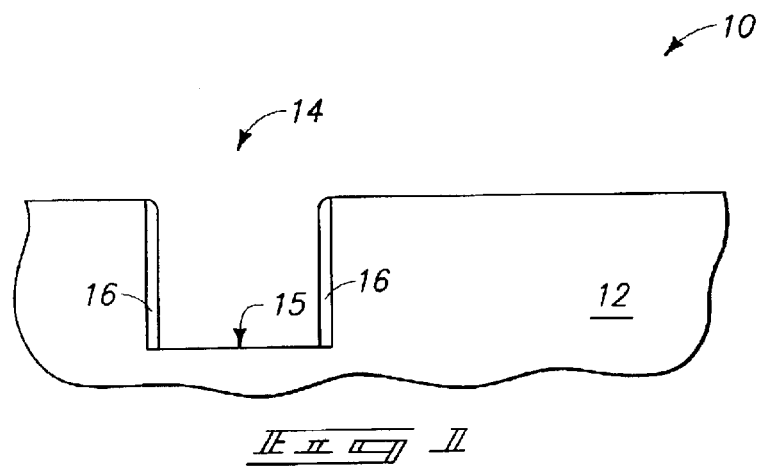
FIG. 1 is a diagrammatic, cross-sectional view of a semiconductor wafer fragment at a preliminary processing stage of a first aspect of the present invention.

A first embodiment of the invention is described with reference to FIGS. 1–4. Referring initially to FIG. 1, such shows a semiconductor wafer fragment 10 at a preliminary processing stage. Fragment 10 comprises a substrate 12 having an opening 14 formed therein. Substrate 12 can comprise a single crystal semiconductor material, such as, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Opening 14 extends into the single crystal semiconductor material of substrate 12, and has a bottom periphery comprising a surface 15 of the semiconductor material substrate 12. In particular aspects, substrate 12 can comprise, consist essentially of, or consist of doped or undoped silicon; and accordingly surface 15 can comprise, consist essentially of, or consist of doped or undoped silicon.

Opening 14 can be formed by, for example, providing a patterned photoresist mask (not shown) over substrate 12, and extending a pattern from the mask into substrate 12 to form the opening. Subsequently, the mask can be removed from over substrate 12.

Electrically insulative material liners 16 are optionally formed along sidewall peripheries of opening 14. The electrically insulative material of sidewall liners 16 can comprise, consist essentially of, or consist of, for example, one or both of silicon dioxide and silicon nitride. Liners 16 can be formed by, for example, providing a layer of suitable electrically insulative material across an upper surface of substrate 12 and within opening 14, and subsequently subjecting such layer to an anisotropic etch. Opening 14 can have any suitable shape, including, for example, a circular shape; and accordingly sidewall liners 16 can correspond to a single liner which extends entirely around the circular sidewall periphery of opening 14.

Figure 2:
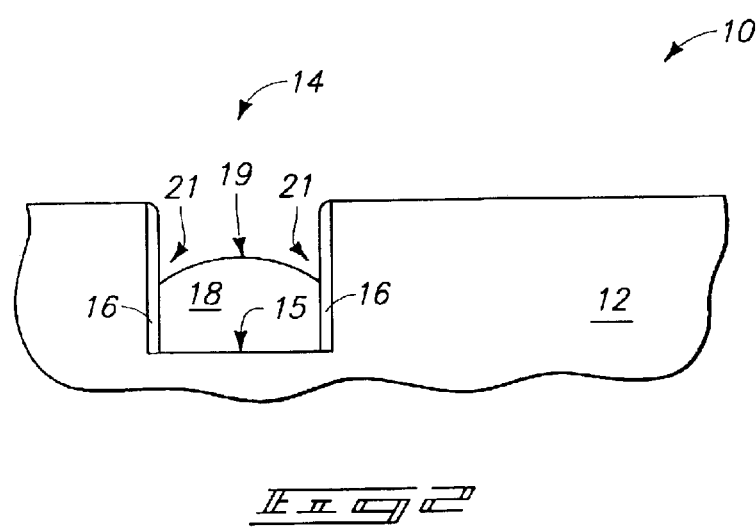
FIG. 2 is a view of the FIG. 1 fragment shown at a processing stage subsequent to that of FIG. 1, in accordance with the first aspect of the invention.

Referring to FIG. 2, a semiconductor material 18 is epitaxially grown from bottom surface 15 of the opening upwardly into the opening to partially fill the opening. In the discussion that follows, semiconductor material 12 can be referred to as a first semiconductor material and epitaxially-grown material 18 can be referred to as a second semiconductor material to aid in distinguishing the semiconductor material from one another. Any suitable method can be utilized for growing semiconductor material 18.

Semiconductor material 18 can comprise, consist essentially of, or consist of silicon. If second semiconductor material 18 comprises silicon, such can be grown utilizing dichlorosilane and a processing temperature of from about 750° C. to about 950° C. A dopant can be provided during the growth of semiconductor 18 so that the semiconductor material is formed to be a doped material. Alternatively, semiconductor material 18 can be formed in the absence of dopant, and accordingly will be a substantially undoped material. If semiconductor material 18 is undoped, and it is desired to provide dopant into semiconductor material 18, such can be provided utilizing a suitable implant in processing subsequent to formation of semiconductor material 18.

Semiconductor material 18 can be grown to fill any desired portion of opening 14. In particular aspects, semiconductor material 18 fills at least one third of opening 14, and in other exemplary aspects semiconductor material 18 fills at least one half of opening 14.

Epitaxially-grown semiconductor material 18 is shown having a curved surface 19. Such curved surface undesirably forms small angle gaps 21 (i.e., faceted or indented corners 21) along the sidewall peripheries of opening 14. In the shown embodiment, the indented corners are formed where surface 19 of semiconductor material 18 contacts sidewall liners 16.

Figure 3:
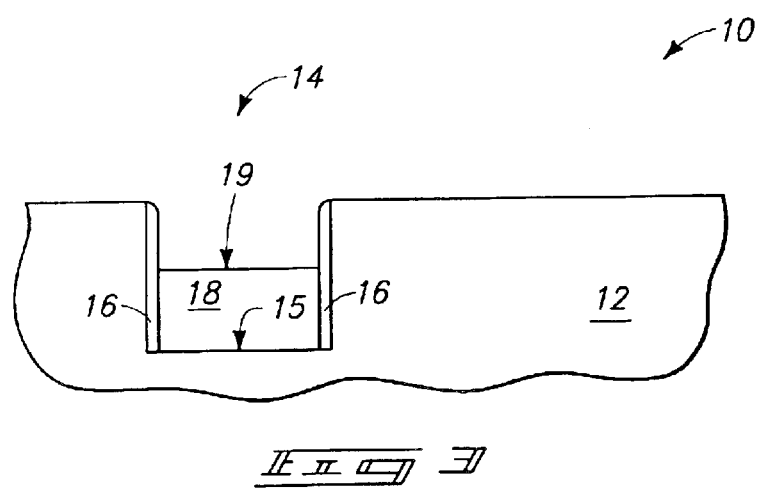
FIG. 3 is a view of the FIG. 1 fragment shown at a processing stage subsequent to that of FIG. 2, in accordance with the first aspect of the invention.

Referring to FIG. 3, fragment 10 is shown after semiconductor material 18 has been subjected to suitable processing to reduce the curvature of surface 19, and accordingly flatten surface 19. Such flattening removes the indents 21 (FIG. 2) that had previously been present along sidewall edges of surface 19. The treatment utilized to flatten surface 19 can comprise, for example, exposure of the surface to at least one hydrogen isotope at a temperature which is greater than or equal to about 750° C. and less than or equal to about 950° C., which can allow the material 18 to relax. The exposure to at least one hydrogen isotope can occur in a chamber while a pressure within the chamber is from about 0.1 Torr to about 50 Torr, and while a flow rate of the at least one hydrogen isotope is from about 0.1 standard liters per minute (slm) to about 50 slm. The at least one hydrogen isotope can comprise, for example, one or both of H (hydrogen) and D (deuterium). In particular aspects, the hydrogen isotope will be provided by flowing $H_2$ gas into a reaction chamber, and allowing interaction between hydrogen atoms of the $H_2$ gas and surface 19. The hydrogen isotope treatment of surface 19 can be referred to as an anneal of material 18 in the presence of hydrogen isotope.

FIG. 9 illustrates an exemplary reaction chamber 100 which can be utilized for treatment of surface 19 of semiconductor material 18. Reaction chamber 100 comprises an interior region 102. A substrate holder 104 is provided within interior region 102, and such is shown supporting a substrate 106. Substrate 106 can comprise, for example, a monocrystalline silicon wafer, and can contain the fragment 10 of FIG. 3.

An inlet 108 extends through a sidewall of chamber 100, and an outlet 110 also extends through the sidewall of chamber 100. In operation, suitable reactant materials 112 are flowed into chamber 100 through inlet 108, and exhaust materials 114 are removed from chamber 100 through outlet 110. Heating coils (not shown) can be provided around chamber 100 to control a temperature within the chamber. Additionally, various temperature control mechanisms can be associated with substrate holder 104 to control a temperature of substrate 106.

Reaction chamber 100 can be utilized for both the epitaxial growth of semiconductor material 18 (FIGS. 2 and 3), and for the treatment of surface 19. In particular aspects, the hydrogen treatment of surface 19 can be done in situ relative to the epitaxial growth of semiconductor material 18. Specifically, appropriate precursors car, be introduced into chamber 100 to epitaxially grow material 18. If material 18 comprises silicon, such precursors can include, for example, dichlorosilane. The epitaxial growth of material 18 can then be stopped by flushing the precursors associated with epitaxial growth out of the chamber. Subsequently, and without breaking the seal of the chamber (i.e., without exposing substrate 106 to atmosphere) appropriate hydrogen isotopes can be introduced into chamber 100 to treat surface 19. For instance, $H_2$ gas can be Introduced into chamber 100 at a flow rate of from about 0.1 slm to about 50 slm, while a pressure within the chamber is maintained at from about 0.1 Torr to about 50 Torr, and while a temperature within the chamber is maintained at from about 750° C. to about 950° C., and typically at a temperature of about 900° C. The treatment with the hydrogen isotope can occur for a time of from about 10 seconds to about 5 minutes, and is typically for a time of about 45 seconds. It is noted that the epitaxial growth of a semiconductor material is frequently conducted at a temperature of from about 750° C. to about 950° C., and accordingly the hydrogen isotope treatment of surface 19 (FIG. 3) can be conducted at the same temperature as was utilized for the epitaxial growth. Accordingly, a temperature within reaction chamber 100 can be maintained for both the epitaxial growth of the semiconductor material and for the hydrogen isotope treatment.

Although it can be advantageous to utilize the same chamber for both the epitaxial growth of semiconductor material and for the hydrogen isotope treatment without breaking a seal to the chamber, it is to be understood that the hydrogen isotope treatment can also be done ex situ relative to the epitaxial growth. Specifically, the epitaxial growth can first occur within a chamber, and subsequently a seal of the chamber can be broken so that the epitaxially-grown semiconductor material is exposed to atmosphere. Such will typically form a native oxide over the epitaxially-grown material. The native oxide can be removed with a suitable cleaning step, such as, for example, a dip in hydrofluoric acid, and subsequently the curved surface of the epitaxially-grown semiconductor material can be treated with hydrogen isotope in accordance with methodology of the present invention. The treatment with the hydrogen isotope can occur in the same chamber utilized for the epitaxial growth, or in a different chamber.

Referring again to FIG. 3, the semiconductor material 18 having the flattened surface 19 can be doped with an appropriate conductivity-enhancing dopant after formation of flattened surface 19, if such is desired. As discussed above, semiconductor material 18 can be formed with dopant, or without dopant, provided therein. Also, dopant can be provided in semiconductor material 18 after formation of the material, and while material 18 has the curved surface of FIG. 2. In further processing, or alternative processing, semiconductor material 18 can be doped with suitable conductivity-enhancing dopant after flattening of surface 19.

Figure 4:
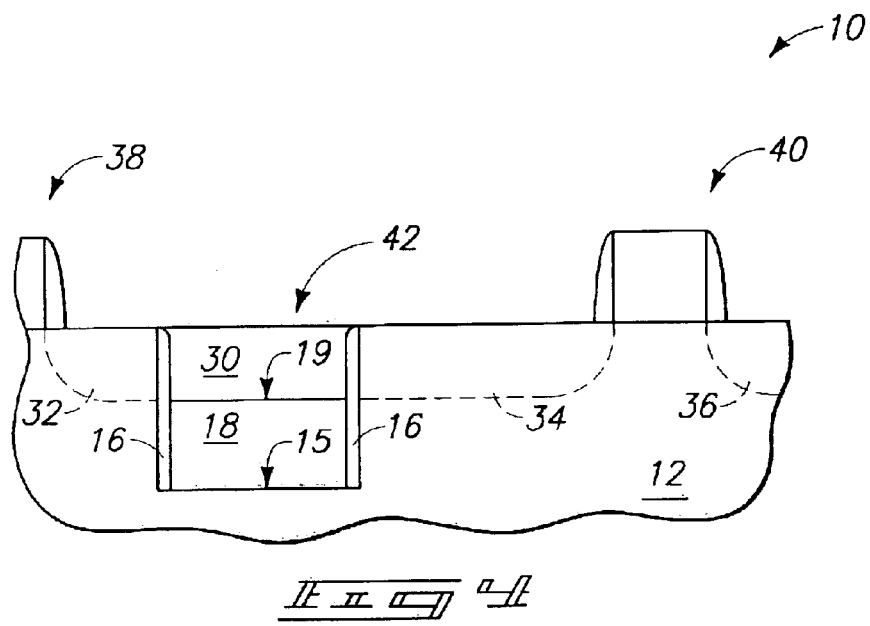
FIG. 4 is a view of the FIG. 1 wafer fragment shown at a processing step subsequent to that of FIG. 3, in accordance with the first aspect of the invention.

Referring to FIG. 4, a material 30 (also referred to herein as a substance) is provided to fill opening 14 (FIG. 3). Material 30 can physically contact the upper surface 19 of epitaxially-grown material 18, as shown. Material 30 is typically only within opening 14, rather than over an upper surface of substrate 12. Material 30 can be formed to be only within the opening, rather than over an upper surface of substrate 12, by any of numerous methods. For instance, a layer of the material 30 can be initially formed within the opening and over the surface of substrate 12, and subsequently the material 30 can be removed from over the surface of substrate 12 by, for example, chemical-mechanical polishing or a suitable etch.

Material 30 can be referred to as a composition, and can comprise, for example, an electrically insulative material. In particular aspects, material 30 can comprise, consist essentially of, or consist of one or both of silicon dioxide and silicon nitride. In some aspects, material 30 can comprise the same insulative material as is utilized for liners 16.

Material 30 and epitaxially-grown material 18, together with liners 16 can define an isolation region 42 which can be utilized for electrically separating circuitry formed over the surface of substrate 12. For instance, a pair of transistor devices 38 and 40 are shown formed on substrate 12. Device 38 has a source/drain region 32, while device 40 has source/drain regions 34 and 36. The isolation region 42 is utilized to electrically isolate source/drain region 32 of one of the transistor devices from the adjacent source/drain region 34 of the other transistor device.

If the combination of materials 18, 30 and 16 is to be utilized as a deep-trenched isolation region between adjacent conductively-doped diffusion regions, it can be advantageous that material 18 be below a lowest depth of the conductively-doped diffusion regions. Alternatively, material 18 can be appropriately doped to amid undesired electrical coupling between material 18 and the source/drain regions, and in such applications material 18 can be at a depth which elevationally overlaps a depth of the adjacent source/drain regions. In the shown aspect of the invention, an interface of materials 18 and 30 is at about a common depth with the lowestmost portions of the source/drain regions 32 and 34 electrically isolated by the isolation region 42.

An advantage of methodology of the present invention is that it can be utilized to form isolation regions in openings having relatively high aspect ratios. Specifically, it is typically difficult to form an insulative material uniformly within a high aspect ratio opening, and such can cause difficulties in uniformly filling deep-trenched isolation regions with insulative material. Methodology of the present invention can be utilized to epitaxially grow silicon from a bottom surface of the deep trenches prior to forming the insulative material which ultimately fills the trenches. Accordingly, methodology of the present invention can be utilized to effectively reduce a critical dimension of a deep trench prior to filling the trench with insulative material, and yet retain the desired isolation properties of a deep-trenched isolation region.

A problem can be encountered, however, if the insulative material is formed within opening 14 prior to flattening an upper surface of material 18. Specifically, the indented regions 21 (FIG. 2) can be difficult to uniformly fill with insulative material, which can make it difficult to consistently form deep-trenched isolation regions having desired properties. However, the flattening of surface 19 can eliminate the problems associated with the indents, and accordingly enable consistent fabrication of high quality deep-trenched isolation regions.

Although the processing of FIGS. 1–4 utilized a single epitaxial growth and surface flattening prior to formation of substance 30, it is to be understood that multiple stages of semiconductor material growth and surface flattening can be utilized in various aspects of the present invention. Specifically, subsequent processing (not shown) can follow the processing of FIG. 3, with such subsequent processing epitaxially growing semiconductor material from flattened surface 19. The semiconductive material grown from surface 19 can have a curved surface which is subjected to the hydrogen isotope annealing to flatten the surface. This process can be repeated multiple times prior to filling a remainder of the opening with substance 30.

The above-described application of utilizing epitaxially-grown material in an isolation region is but one of many applications where the flattening of a surface of epitaxially-grown silicon can be useful. Another application is to flatten a surface of epitaxially-grown elevated source/drain regions. Such aspect is described with reference to FIGS. 5–8.

Figure 5:
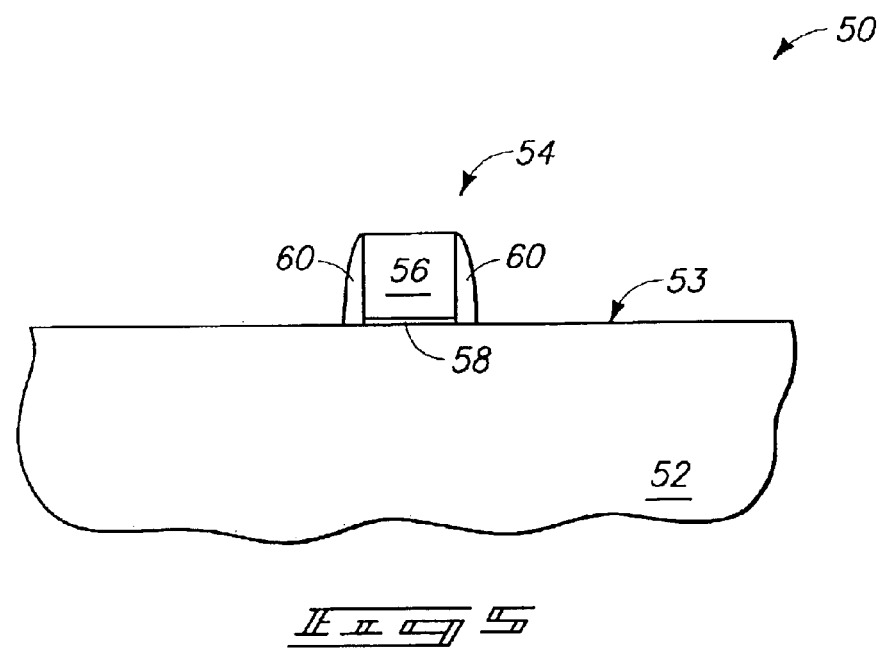
FIG. 5 is a diagrammatic, cross-sectional view of a semiconductor wafer fragment at a preliminary processing stage in accordance with a second aspect of the invention.

Referring initially to FIG. 5, such shows a semiconductor wafer fragment 50 at a preliminary processing stage. Fragment 50 comprises a substrate 52 having a transistor gate 54 formed thereover. Substrate 52 can comprise a single crystal semiconductor material, such as, for example, monocrystalline silicon, and in particular aspects can consist essentially of, or consist of doped or undoped silicon. Substrate 52 comprises an upper surface 53, and transistor gate 54 is formed over such upper surface. Gate 54 comprises a gate stack 56 which can include insulative and conductive materials, as is known in the art. The conductive materials of gate stack 56 are separated from substrate 52 by an insulative material 58 which can comprise, for example, gate oxide, and can consist essentially of, or consist of silicon dioxide. Sidewall spacers 60 are formed along sidewalls of gate 56 in accordance with conventional methodologies.

Figure 6:
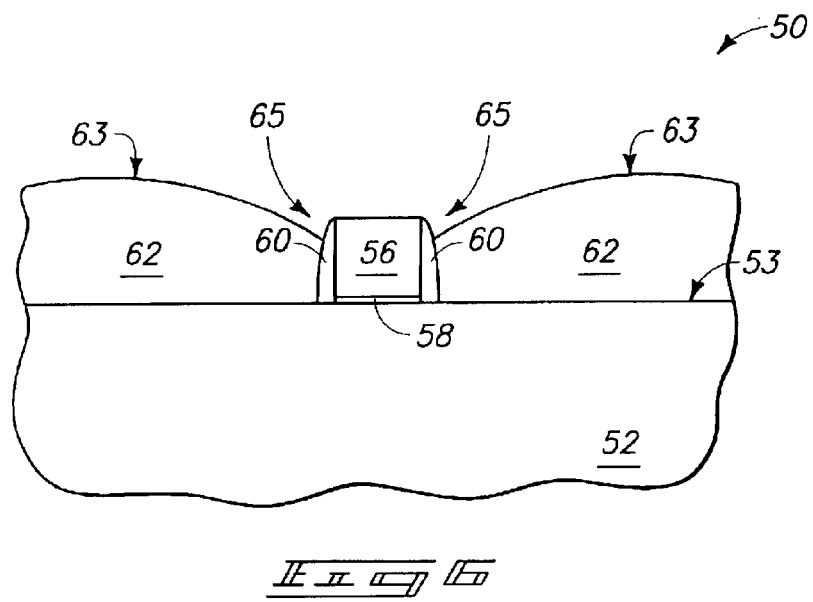
FIG. 6 is a view of the FIG. 5 wafer fragment shown at a processing stage subsequent to that of FIG. 5, in accordance with the second aspect of the invention.

Referring to FIG. 6, semiconductor material 62 is epitaxially grown upwardly from surface 53 of substrate 52. The epitaxially-grown material 62 ultimately forms elevated source/drain regions of a transistor device. Epitaxially-grown material 62 can comprise, consist essentially of, or consist of doped or undoped silicon, for example, and can be formed from dichlorosilane in accordance with procedures described previously with reference to formation of epitaxially-grown material 18 of FIG. 2. A problem with the semiconductor material 62 is that such has a curved upper surface 63, which leads to indents (facets) 65 where the upper surface joins to insulative sidewall spacers 60. Typically, dopant is implanted into epitaxially-grown material 62 to form source/drain regions comprising the material. If dopant is implanted through curved surfaces 63, the dopant profile will typically reflect the curvature of the surfaces. It is undesirable to have a curved dopant profile within the elevated source/drain regions of a transistor device.

Figure 7:
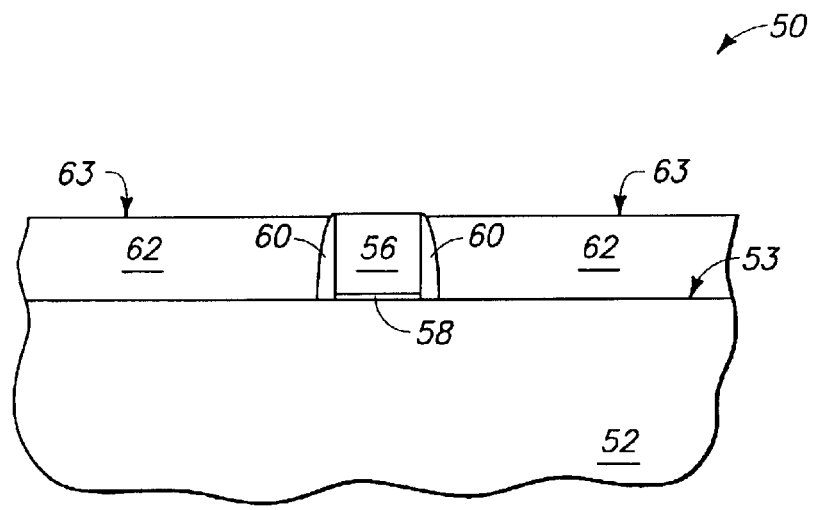
FIG. 7 is a view of the FIG. 5 wafer fragment shown at a processing stage subsequent to that of FIG. 6, in accordance with the second aspect of the invention.

Referring to FIG. 7, surface 63 can be treated with a hydrogen isotope (utilizing the methodology described above with reference to FIG. 3), to flatten surface 63. Such removes the indented corner regions 65 (FIG. 6), and provides a planar upper surface suitable for a subsequent dopant implant.

Referring to FIG. 8, the dopant implant is illustrated. Specifically, a dopant 70 is shown implanted into epitaxially-grown material 62, and utilized to form a conductivity-enhanced diffusion region 72 which extends through epitaxial material 62 and into substrate 52. The conductivity-enhanced diffusion regions correspond to source/drain regions gatedly connected to one another through transistor gate 56. Semiconductor material 62 can be conductively-doped with the implant of dopant 70, or through additional doping which can incur either during growth of epitaxial material 62, or subsequent to such growth. The doped material 62 corresponds to elevated source/drain regions associated with a transistor device 74 comprising gate 56. It is noted that although gate 56 is shown formed prior to the epitaxial growth of material 62, the invention encompasses alternative aspects (not shown) wherein the gate is provided subsequent to the epitaxial growth of material 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an isolation region, comprising:
forming an opening extending into a single crystal first semiconductor material, the opening having a bottom periphery comprising a surface of the first semiconductor material;
epitaxially growing second semiconductor material from the bottom periphery of the opening upwardly into the opening to partially fill the opening, the epitaxially grown second semiconductor material having an uppermost surface within the partially-filled opening;
exposing the uppermost surface of the epitaxially grown second semiconductor material to a hydrogen isotope to flatten said uppermost surface; and
after flattening the uppermost surface, forming an insulative material over the second semiconductor material within the opening.

2. The method of claim 1 further comprising epitaxially growing a third semiconductor material over the second semiconductor material after flattening the uppermost surface of the second semiconductor material, and wherein the insulative material is formed over the third semiconductor material.

3. The method of claim 1 wherein the insulative material is formed physically against the second semiconductor material.

4. The method of claim 1 wherein the insulative material is silicon dioxide and is formed physically against the second semiconductor material.

5. The method of claim 1 wherein the second semiconductor material fills at least one-half of the opening.

6. The method of claim 1 wherein the second semiconductor material fills at least one-half of the opening.

7. The method of claim 1 wherein the first semiconductor material comprises silicon.

8. The method of claim 1 wherein the first semiconductor material consists essentially of doped or undoped silicon.

9. The method of claim 1 wherein the first semiconductor material consists of doped or undoped silicon.

10. The method of claim 1 wherein the second semiconductor material comprises silicon.

11. The method of claim 1 wherein the second semiconductor material consists essentially of doped or undoped silicon.

12. The method of claim 1 wherein the second semiconductor material consists of doped or undoped silicon.

13. The method of claim 1 wherein the exposure to the hydrogen isotope comprises exposure to $H_2$.

14. The method of claim 13 wherein the epitaxial growth occurs at a temperature, wherein the temperature is maintained alter the epitaxial growth is stopped, and wherein the exposure to the $H_2$ occurs while the temperature is maintained.

15. The method of claim 14 wherein the temperature is greater than or equal to about 750° C. and less than or equal to about 950° C.

16. The method of claim 14 wherein the temperature is greater than or equal to about 750° C. and less than or equal to about 950° C.; and wherein the exposure to the $H_2$ occurs in a chamber while a pressure within the chamber is from about 0.1 Torr to about 50 Torr, and while a flow rate of the $H_2$ is from about 0.1 slm to about 50 slm.

17. A method of forming elevated source/drain regions, comprising:
providing a semiconductor substrate;

epitaxially growing semiconductor material upwardly from the substrate to form a pair of elevated source/drain regions of a transistor device;

stopping the epitaxial growth and exposing an upper surface of the epitaxially-grown semiconductor material to at least one hydrogen isotope after the epitaxial growth is stopped; the exposure to the at least one hydrogen isotope flattening the upper surface of the epitaxially-grown semiconductor material;

after flattening the upper surface of the epitaxially-grown semiconductor material, implanting conductivity-enhancing dopant into the epitaxially-grown semiconductor material;

providing a transistor gate between the pair of elevated source/drain regions and gatedly connecting the elevated source/drain regions to one another; and wherein the epitaxial growth occurs at a temperature, wherein the temperature is maintained after the epitaxial growth is stopped, and wherein the exposure to the at least one hydrogen isotope occurs while the temperature is maintained.

18. The method of claim 17 wherein the temperature is greater than or equal to about 750° C. and less than or equal to about 950° C.

* * * * *

UNITED STATES PATENT AND TRADEMARK OFFICE
CERTIFICATE OF CORRECTION

| | | |
|---|---|---|
| PATENT NO. | : 6,911,367 B2 | Page 1 of 1 |
| APPLICATION NO. | : 10/418696 | |
| DATED | : June 28, 2005 | |
| INVENTOR(S) | : Eric R. Blomiley et al. | |

It is certified that error appears in the above-identified patent and that said Letters Patent is hereby corrected as shown below:

Title page,
Item [57], ABSTRACT,
Line 4, replace "regions and elevated/source drain regions. A method of"
with -- regions and elevated source/drain regions. A method of --.

Column 4,
Line 59, replace "Specifically, appropriate precursors car, be introduced into"
with -- Specifically, appropriate precursors can be introduced into --.

Column 6,
Line 14, replace "18 can be appropriately doped to amid undesired" with -- 18 can be appropriately doped to avoid undesired --.

Column 8,
Line 33, replace "material fills at least one-half of the opening."
with -- material fills at least one-third of the opening. --.

Signed and Sealed this

Twentieth Day of June, 2006

JON W. DUDAS
*Director of the United States Patent and Trademark Office*